United States Patent
Elliot et al.

(10) Patent No.: US 11,823,890 B2
(45) Date of Patent: *Nov. 21, 2023

(54) MULTIPLE ZONE HEATER

(71) Applicant: WATLOW ELECTRIC MANUFACTURING COMPANY, St. Louis, MO (US)

(72) Inventors: Alfred Grant Elliot, Palo Alto, CA (US); Brent Donald Alfred Elliot, Cupertino, CA (US); Frank Balma, Los Gatos, CA (US); Richard Erich Schuster, Milpitas, CA (US); Dennis George Rex, Williams, OR (US); Alexander Veytser, Mountain View, CA (US)

(73) Assignee: WATLOW ELECTRIC MANUFACTURING COMPANY, St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/981,962

(22) Filed: Nov. 7, 2022

(65) Prior Publication Data

US 2023/0058143 A1 Feb. 23, 2023

Related U.S. Application Data

(63) Continuation of application No. 15/955,693, filed on Apr. 18, 2018, now Pat. No. 11,495,450, which is a continuation of application No. 13/831,670, filed on Mar. 15, 2013, now Pat. No. 9,984,866.

(60) Provisional application No. 61/757,090, filed on Jan. 25, 2013, provisional application No. 61/728,810, filed on Nov. 21, 2012, provisional application No. 61/707,865, filed on Sep. 28, 2012, provisional application No. 61/658,896, filed on Jun. 12, 2012.

(51) Int. Cl.
*H01L 21/02* (2006.01)
*H01L 21/67* (2006.01)
(Continued)

(52) U.S. Cl.
CPC .. *H01L 21/02002* (2013.01); *H01L 21/67103* (2013.01); *H01L 21/67248* (2013.01);
(Continued)

(58) Field of Classification Search
CPC ......... H01L 21/02002; H01L 21/67103; H01L 21/67248; H01L 21/68735; H01L 21/68792; H01L 21/6832; H01L 21/6833; H01L 21/67109; H01L 21/3065; H01L 21/31116; H01L 21/31138; H01L 21/31144; H01L 21/32137;
(Continued)

(56) References Cited

U.S. PATENT DOCUMENTS

2012/0299253 A1\* 11/2012 Kosakai .............. H01L 21/6831
279/128

\* cited by examiner

*Primary Examiner* — Dana Ross
*Assistant Examiner* — Joe E Mills, Jr.
(74) *Attorney, Agent, or Firm* — Burris Law, PLLC

(57) ABSTRACT

A multi-zone heater with a plurality of thermocouples such that different heater zones can be monitored for temperature independently. The independent thermocouples may have their leads routed out from the shaft of the heater in a channel that is closed with a joining process that results in hermetic seal adapted to withstand both the interior atmosphere of the shaft and the process chemicals in the process chamber. The thermocouple and its leads may be enclosed with a joining process in which a channel cover is brazed to the heater plate with aluminum.

20 Claims, 16 Drawing Sheets

(51) Int. Cl.
*H01L 21/687* (2006.01)
*H05B 3/28* (2006.01)

(52) U.S. Cl.
CPC ....... *H01L 21/68792* (2013.01); *H05B 3/283* (2013.01); *H05B 2203/002* (2013.01); *H05B 2203/037* (2013.01)

(58) Field of Classification Search
CPC ............ H01L 21/67069; H01L 21/687; H01L 21/68764; H01L 21/68771; H01L 21/31; H01L 21/68785; H01L 22/26; H05B 2203/002; H05B 2203/037; H05B 2203/283; H05B 2203/016; H05B 2203/017; H05B 2203/003; H05B 2203/013; H05B 3/28; H05B 3/02; H05B 3/005; H05B 3/007; H05B 3/00; H05B 3/03; H05B 3/10; H05B 3/143; H05B 3/20; H05B 3/286; H05B 3/48; H05B 1/0233; H05B 3/283; H01J 37/32082; H01J 37/32724; H01J 37/334; H01J 37/32091; H01J 37/2001; H01J 37/32183; H01J 37/32541; H01J 37/32642; H01J 37/32935; H01J 37/332; H01J 37/32009; H01J 37/32174; H01J 37/3244; H01J 37/32577; H01J 37/32697; H01J 37/32706; H01J 37/32715; H02N 13/00
USPC ...................................................... 219/444.1
See application file for complete search history.

MULTIPLE ZONE HEATER

CROSS-REFERENCE TO RELATED APPLICATIONS

This application is a continuation of U.S. patent application Ser. No. 15/955,693 filed Apr. 18, 2018, which is a continuation of U.S. patent application Ser. No. 13/831,670 filed Mar. 15, 2013 (now U.S. Pat. No. 9,984,866), which claims priority to U.S. Provisional Application No. 61/658,896 filed Jun. 12, 2012, which claims priority to U.S. Provisional Application No. 61/707,865 filed Sep. 28, 2012, which claims priority to U.S. Provisional Application No. 61/728,810 filed Nov. 21, 2012, which claims priority to U.S. Provisional Application No. 61/757,090 filed Jan. 25, 2013. The disclosures of the above applications are incorporated herein by reference.

FIELD

The present invention relates to heater used in semiconductor processing, and more specifically to a heater with multiple heater zones and thermocouples to monitor those zones.

BACKGROUND

The statements in this section merely provide background information related to the present disclosure and may not constitute prior art.

In semiconductor manufacturing, silicon substrates (wafers) are processed at elevated temperatures for deposition of numerous different materials. Temperatures typically range in the 300-550 C range, but can at times go as high as 750 C or even higher. The deposited materials are "grown" in a layer on the surface of the wafer. Many of these materials have growth rates which are extremely sensitive to temperature, so variations of the temperature across the wafer can affect the local growth rate of the film, causing variations in the film thickness as it is grown across the wafer.

It is desired to control the variations in thickness of the deposited films. Sometimes it is desired to have the films thicker in the center of the wafer (like a dome). Sometimes it is desired to have the films thicker on the edge (like a crater or dimple). Sometimes it is desired to have the film thickness as even as possible (within tens of angstroms).

One of the most direct methods for controlling the temperature of the wafer, and thereby the thickness profile of the as-deposited films, is to place the wafer on a heater. By designing the heater with a specific watt-density "map" which produces the temperature profile desired on the wafer, the desired film thickness profile can be produced. Watt-density of the underlying heater is increased in the location(s) where higher temperatures are desired on the wafer, and decreased in the location(s) where lower wafer temperatures are desired.

It is desired by chip manufacturers to have the ability to run different processes in the same process chamber. Capital equipment for growing films is very expensive (more than $1 million per process chamber is typical), so it is desired to maximize the usage of, and minimize the number of required process chambers. Different temperature processes with different chemistries are run in the same chamber to produce different films. These different films may also have different growth-rate vs. temperature behavior. This leads the chip manufacturers to desire the ability to change the watt-density map of a heater in a given process chamber "on-the-fly" to achieve the desired film thickness profile.

Additionally, it is desired by chip manufacturers to have the ability to run exactly the same "recipe" in multiple process chambers and produce films that have matching film thickness profiles (as well as other properties which can be affected by temperature such as film stress, refractive index, and others). Therefore, it is desired to have the ability to produce a heater which can have very repeatable watt-density maps from unit to unit.

A heater can be made with the ability to change the watt-density map by using multiple independent heater circuits within the heater. By varying the voltages and currents applied to the different circuits, you can change the power levels in the locations of the individual circuits. The locations of these specific circuits are called "zones". By increasing the voltage (and thereby the current as these heater elements are all resistance heaters) to a given zone, you increase the temperature in that zone. Conversely, when you decrease the voltage to a zone, you decrease the temperature in that zone. In this way, different watt-density maps can be produced by the same heater by changing the power to the individual zones.

At least two limitations have affected chip makers' ability to effectively use multi-zone heaters. The first limitation is that current state-of-the-art heaters have only one control thermocouple. Only one control thermocouple can be used because the plate-and-shaft design currently used for heaters allows for location of a thermocouple at the center of the heater plate only, or within a radius of ~1 inch of the center of the heater. Thermocouples are made of metals which are incompatible with the processing environment of the wafer, and therefore must be isolated from that environment. Additionally, for fastest response of a thermocouple (TC) it is best to have it operating in an atmospheric pressure environment, not the vacuum environment of a typical process chamber. Therefore, TCs can only be located within the central hollow area of the heater shaft which is not in communication with the process environment. If there are heater zones located outside of the 2 inch diameter of the heater shaft, then no TC can be installed there to monitor and help control the temperature of that zone.

This limitation has been addressed by using "slaved" power ratios to control heater zones located outside of the central area of the heater. Ratios are established of the power to be applied to the central zone and to each of the other zones which produce the desired watt-density map. The central control TC monitors the temperature of the central zone, and the power applied to the central zone (which is based on the feedback of the central control TC) is then applied to all zones as adjusted by the pre-established ratios. For example, with a two-zone heater, let us assume that a ratio of 1.2 to 1.0 of power applied to the outer and inner zones produces the desired temperature profile. Let us assume that the heater control system, by reading the temperature data provided by the central control TC, determines that a voltage of 100 VAC is needed to achieve the proper temperature. With the slaved ratio control methodology, a voltage of 120 VAC will thereby be applied to the outer heater zone, and a voltage of 100 VAC will be applied to the inner zone. The watt-density map can thereby be adjusted by changing the slave ratios.

This leads us to the second limitation. Current state-of-the-art heaters have an inherent variation of the resistance of the embedded heater(s). Due to the high temperatures and pressures required in the manufacturing process of current ceramic heaters, the resistance tolerance achievable can approach 50%. In other words, a typical resistance for a semiconductor-grade ceramic heater element is within a range of 1.8-3.0 ohms (at room temperature—the heater element material is typically molybdenum, which increases in resistance as the operating temperature increases).

This variation causes a problem with maintaining a repeatable watt-density-map from unit to unit with multi-zone heaters controlled by the slave-ratio method. With single zone heaters, the resistance variation may not be an issue, because a control TC is utilized to monitor the actual operating temperature, and power levels fed to the heater are adjusted accordingly. But if you have a multi-zone heater, and the heater element resistance variations can approach 50%, then the slave ratio control methodology will not produce a repeatable watt density map from unit to unit.

What is called for is to establish a heater design which will allow installation of multiple control TCs which can be physically located within the respective heater zones to allow for feedback and control directly, and yet still keep the TCs isolated from the processing environment within the process chamber.

SUMMARY

This section provides a general summary of the disclosure and is not a comprehensive disclosure of its full scope or all of its features.

According to one form of the present disclosure, a multi-zone heater includes a multi-layer heater plate having a top plate layer of ceramic, a bottom plate layer of ceramic, and one or more intermediate plate layers of ceramic that are disposed between the top plate layer and the bottom plate layer. A plurality of plate joining layers are disposed between the plate layers and join the plate layers with hermetic joints. A plurality of heater element zones between two of the plate layers are adapted to be individually controlled. A plurality of thermocouples is mounted between two of the plate layers and are located at a plurality of distances from the top plate layer. The thermocouples include thermocouple leads. The multi-zone heater further includes a ceramic hollow heater shaft having an interior surface that defines an interior of the hollow heater shaft and an exterior surface. The ceramic hollow heater shaft is attached to a bottom surface of the multi-layer heater plate and each of the hermetic joints have a vacuum leak rate of $<1\times10^{-9}$ sccm He/sec, and the thermocouple leads are routed through the interior of said ceramic hollow heater shaft.

In variations of this form, which may be implemented individually or in any combination: one or more of the thermocouples are located outside of the area circumscribed by the exterior surface of the hollow heater shaft; a joining layer is disposed between the hollow heater shaft and the multi-layer plate; a plurality of plate joining layers includes metallic aluminum; the joining layer between the hollow heater shaft and the multi-layer plate includes metallic aluminum; the hollow heater shaft includes aluminum nitride; a central hub is disposed between the hollow heater shaft and the multi-layer plate; the plurality of plate joining layers include metallic aluminum of greater than 99% by weight; and, the plurality of plate joining layers include metallic aluminum of greater than 99% by weight and the joining layers between the hollow heater shaft and the multi-layer plate includes metallic aluminum of greater than 99% by weight.

According to a second form of the present disclosure, a multi-zone heater includes a multi-layer heater plate having a top plate layer of ceramic, a bottom plate layer of ceramic, and an intermediate plate layer of ceramic that is disposed between the top plate layer and the bottom plate layer. A joining layer is disposed between the top plate layer and the bottom plate layer, and the joining layer joins the plate layers with a hermetic joint having a vacuum leak rate of $<1\times10^{-9}$ sccm He/sec. A plurality of heater element zones are between two of the plate layers and are adapted to be individually controlled. A first thermocouple is mounted between the top plate layer and the intermediate plate layer and a second thermocouple is mounted between the intermediate plate layer and the bottom plate layer. The first and second thermocouples include thermocouple leads. The multi-zone heater further includes a ceramic hollow heater shaft having an interior surface that defines an interior of the hollow heater shaft and an exterior surface. The ceramic hollow heater shaft is attached to a bottom surface of the multi-layer heater plate.

In variations of this form, which may be implemented individually or in any combination: the joining layer includes metallic aluminum; the joining layer includes metallic aluminum of greater than 99% by weight; the top plate layer includes aluminum nitride; and, the bottom plate layer includes aluminum nitride.

According to a third form of the present disclosure, a multi-zone heater includes a multi-layer heater plate having a top plate layer of ceramic, a bottom plate layer of ceramic, and one or more intermediate plate layers of ceramic that are disposed between the top plate layer and the bottom plate layer. A plurality of plate joining layers are disposed between the plate layers and join the plate layers with hermetic joints. A plurality of heater element zones between two of the plate layers are adapted to be individually controlled. The multi-zone heater further includes a ceramic hollow heater shaft having an interior surface that defines an interior of the hollow heater shaft and an exterior surface. The ceramic hollow heater shaft is attached to a bottom surface of the multi-layer heater plate. A plurality of thermocouples are mounted between two of the plate layer and are located at a plurality of distances from the top plate layer and from the ceramic hollow heater shaft. Each of the hermetic joints have a vacuum leak rate of $<1\times10^{-9}$ sccm He/sec. The thermocouples include thermocouple leads.

In variations of this form, which may be implemented individually or in any combination: the thermocouples are located outside of the area circumscribed by the exterior surface of the hollow heater shaft; a joining layer is disposed between the hollow heater shaft and the multi-layer plate; and a plurality of plate joining layers includes metallic aluminum.

A multi-zone heater with a plurality of thermocouples such that different heater zones can be monitored for temperature independently. The independent thermocouples may have their leads routed out from the shaft of the heater in a channel that is closed with a joining process that results in hermetic seal adapted to withstand both the interior atmosphere of the shaft and the process chemicals in the process chamber. The independent thermocouples may have their leads routed out from the shaft of the heater in a space between plate layers, wherein the plate layers are joined with a joining process that results in hermetic seal adapted to withstand both the interior atmosphere of the shaft and the process chemicals in the process chamber. The thermocouple and its leads may be enclosed with a joining process in which a channel cover, or a bottom plate layer, is brazed to the heater plate with aluminum.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
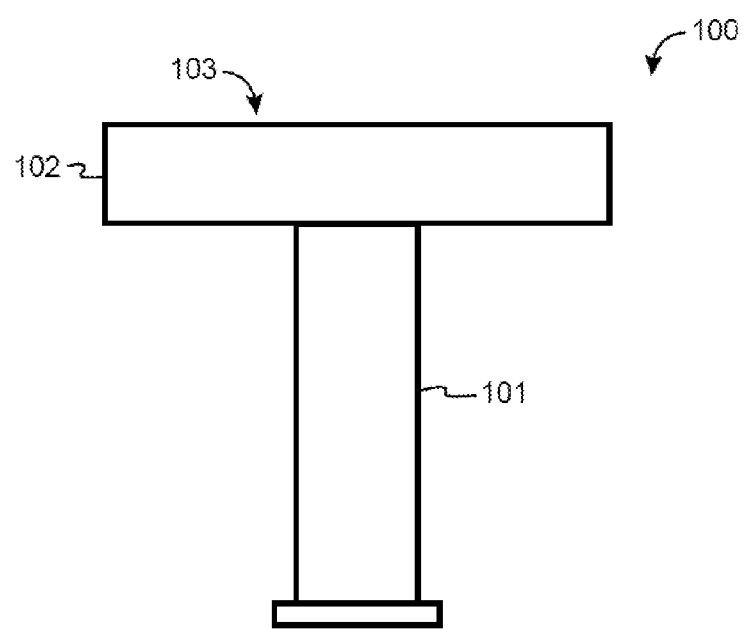
FIG. 1 is a view of a plate and shaft device used in semiconductor processing according to some embodiments of the present invention.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 illustrates an exemplary plate and shaft device 100, such as a heater, used in semiconductor processing. In some aspects, the plate and shaft device 100 is composed of a ceramic, such as aluminum nitride. The heater has a shaft 101 which in turn supports a plate 102. The plate 102 has a top surface 103. The shaft 101 may be a hollow cylinder. The plate 102 may be a flat disc. Other subcomponents may be present. In some present processes, the plate 102 may be manufactured individually in an initial process involving a process oven wherein the ceramic plate is formed. In some embodiments, the plate may be joined to the shaft with a low temperature hermetic joining process as described below.

Figure 2:
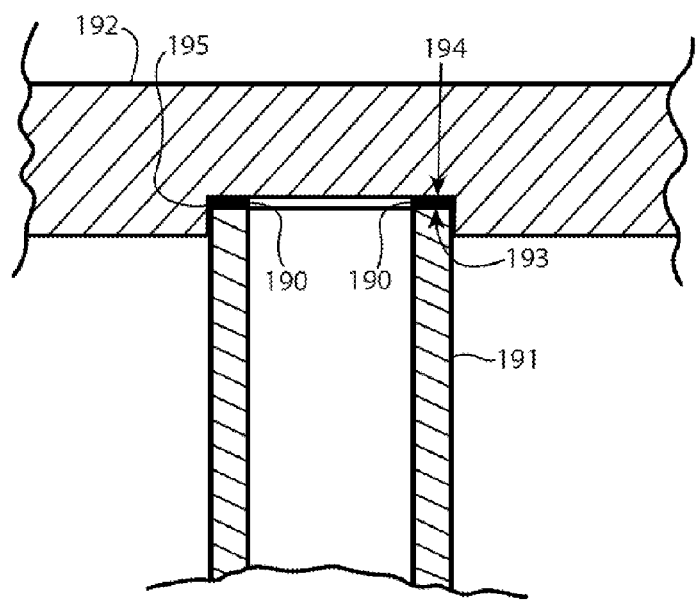
FIG. 2 is a cross-sectional view of a joint between a plate and shaft according to some embodiments of the present invention.

FIG. 2 shows a cross section in which a first ceramic object, which may be a ceramic shaft 191, for example, may be joined to a second ceramic object, which may be made of the same or a different material, and which may be a ceramic plate 192, for example. A joining material, such as brazing layer 190, may be included, which can be selected from the combinations of braze layer materials described herein and may be delivered to the joint according to the methods described herein. In some aspects, the plate may be aluminum nitride and the shaft may be aluminum nitride, zirconia, alumina, or other ceramic. In some aspects, it may be desired to use a shaft material with a lower conductive thermal transfer coefficient in some embodiments.

With respect to the joint depicted in FIG. 2, the shaft 191 may be positioned such that it abuts the plate, with only the brazing layer interposed between the surfaces to be joined, for example surface 193 of the shaft and surface 194 of the plate. The interface surface 194 of the plate 192 may reside in a recess 195 in the plate. The thickness of the joint is exaggerated for clarity of illustration. In an exemplary embodiment, the plate and shaft may both be of aluminum nitride and both have been separately formed previously using a liquid phase sintering process. The plate may be approximately 9-13 inches in diameter and 0.5 to 0.75 inches thick in some embodiments. The shaft may be a hollow cylinder which is 5-10 inches long with a wall thickness in the 0.1 inches and an exterior diameter in the range 1-3 inches. The plate may have a recess adapted to receive an outer surface of a first end of the shaft.

Figure 3:
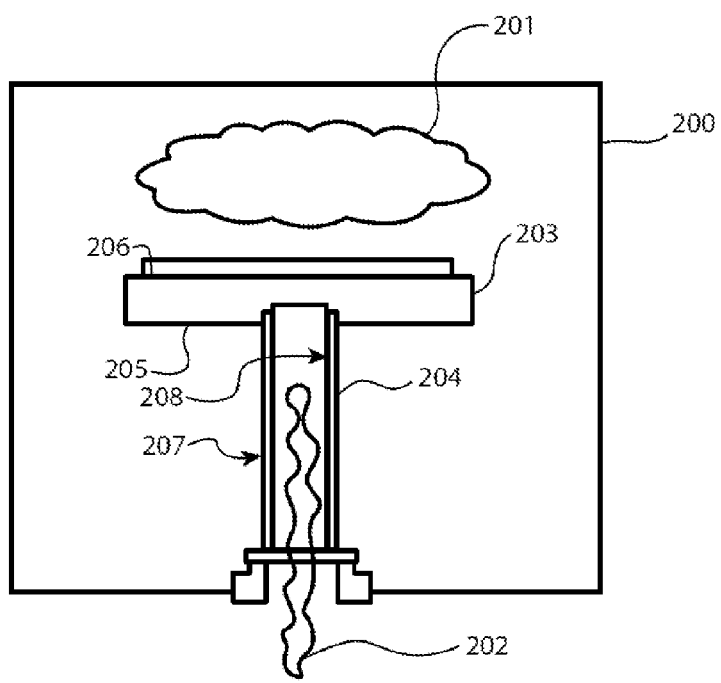
FIG. 3 is a view of a plate and shaft device in a process chamber according to some embodiments of the present invention.

As seen in FIG. 3, the brazing material of joints used on heaters, or other devices, may bridge between two distinct atmospheres, both of which may present significant problems for prior brazing materials. On an external surface 207 of the semiconductor processing equipment, such as a heater 205, the brazing material must be compatible with the processes occurring in, and the environment 201 present in, the semiconductor processing chamber 200 in which the heater 205 will be used. The environment 201 present in the processing chamber 200 may include fluorine chemistries. The heater 205 may have a substrate 206 affixed to a top surface of the plate 203, which is supported by a shaft 204. On an internal surface 208 of the heater 205, the brazing layer material must be compatible with a different atmosphere 202, which may be an oxygenated atmosphere. Prior brazing materials used with ceramics have not been able to meet both of these criteria. For example, braze elements containing copper, silver, or gold may interfere with the lattice structure of the silicon wafer being processed, and are thus not appropriate. However, in the case of a brazed joint joining a heater plate to a heater shaft, the interior of the shaft typically sees a high temperature, and has an oxygenated atmosphere within the center of the hollow shaft. The portion of the braze joint which would be exposed to this atmosphere will oxidize, and may oxidize into the joint, resulting in a failure of the hermeticity of the joint. In addition to structural attachment, the joint between the shaft and the plate of these devices to be used in semiconductor manufacturing must be hermetic in many, if not most or all, uses.

Figure 4:
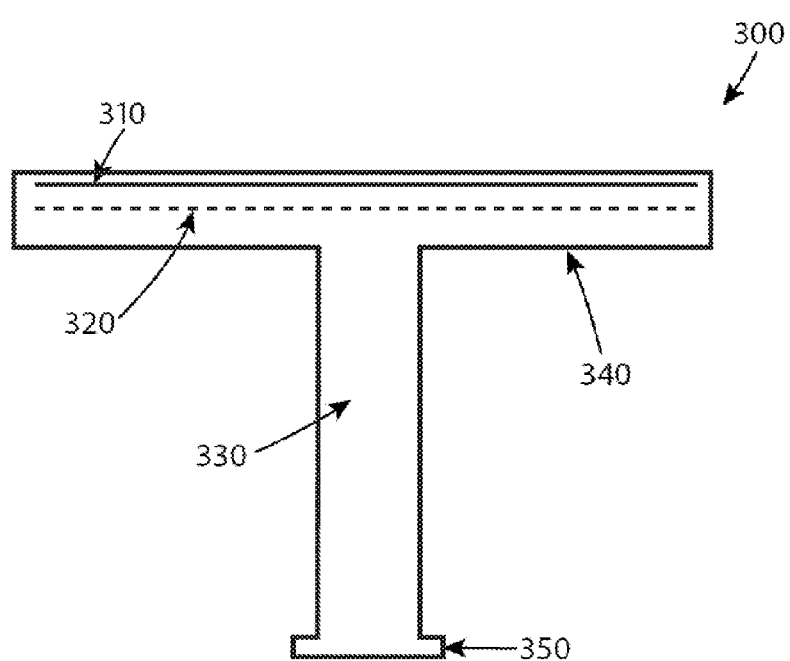
FIG. 4 is a view of a heater device according to some embodiments of the present invention.

FIG. 4 shows one embodiment of a schematic illustration of a heater column used in a semiconductor processing chamber. The heater 300, which may be a ceramic heater, can include a radio frequency antenna 310, a heater element 320, a shaft 330, a plate 340, and a mounting flange 350.

Figure 5:
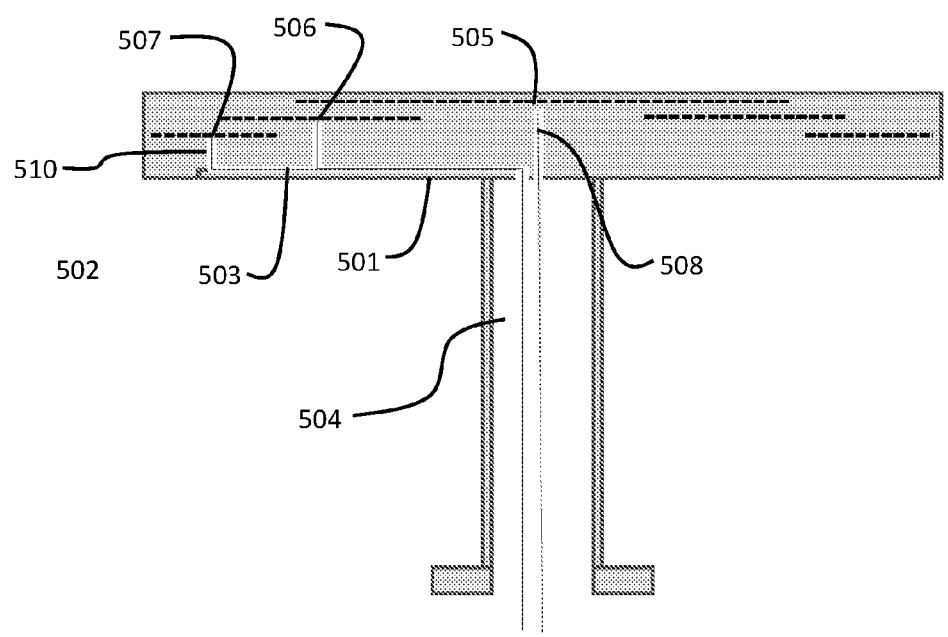
FIG. 5 is an illustrative cross-sectional sketch of a multi-zone heater according to some embodiments of the present invention.

In some embodiments of the present invention, as seen in FIG. 5, a cover plate 501 may be bonded to the backside of a heater plate 502, covering a hollow area 503 that may be contiguous with the heater shaft hollow core 504. The use of a radial feeder, such as the covered hollow area, allows individual control thermocouples to be used to directly monitor the local temperature at each heater zone of a multi-zone heater. Thermocouples 505, 506, 507 may be installed within thermocouple wells 508, 509, 510 located at each individual heater zone. The thermocouples may be installed into these wells which are located within the covered hollow area, or channel. In some embodiments, machining of the plate may be performed in the channel to allow for deeper installation of the thermocouple. The thermocouples may then be covered with a ceramic cover plate 501 positioned on the heater plate backside and between the heater plate and shaft. The heater plate, hollow area cover plate, and heater shaft are then bonded together. This isolates the thermocouples from the process environment, and provides direct feedback of the temperature of each heater zone for traditional control. In some heater designs, the heater is fully embedded within the plate during the manufacturing process of the plate. This processing may entail high temperature, which may be in the range of 1700 C, and high pressing contact force during the formation of the plate. Although the heater element itself may be adapted to withstand this processing, thermocouples and the leads into the thermocouples, which may be made of Inconel, are not able to withstand this processing. With installation of thermocouples after the final sintering and pressing of the ceramic plate, the thermocouples must then be protected from the process chemistries which the heater will be exposed to during its use. The use of multiple thermocouples to monitor the temperature of areas of the plate which have separate heaters allows for temperature control of these areas of the plate based upon actual temperature readings.

The thermocouple wells may reach into the plate to the level of the heater element. In some embodiments, the heater element may have an open area so that the thermocouple well does not go down into the heater element, but to the same depth in an area where there is a gap or space in the heater element. In some embodiments, the hollow area, and the thermocouple wells, may be machined into the heater plate after fabrication of the heater plate with the multi-zone heater elements within it. The multi-zone heater elements may be in the ceramic heater plate when the plate is manufactured. The hollow area cover plate may be joined to the heater plate, and in some aspects also to a portion of the shaft, using a low temperature joining process as described herein.

Figure 6:
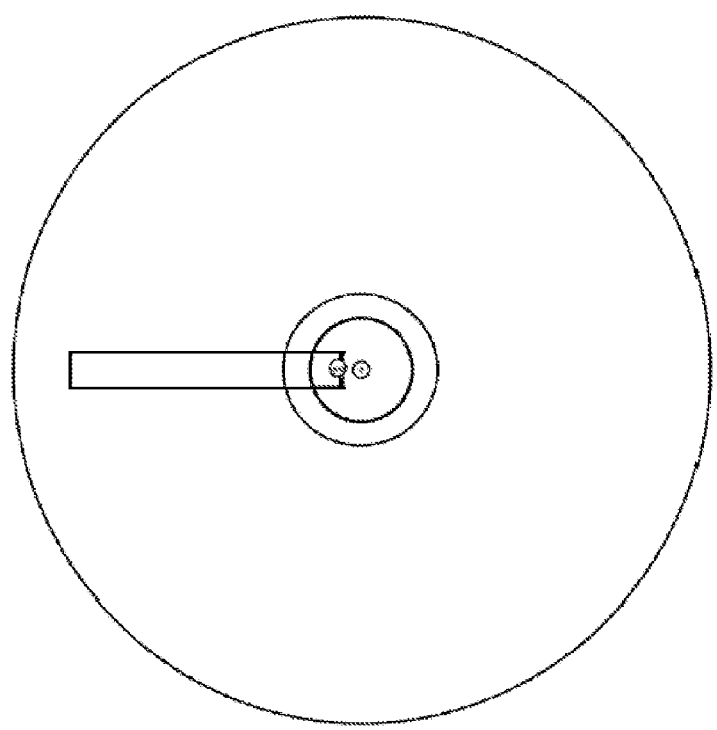
FIG. 6 is an illustrative bottom view of a multi-zone heater according to some embodiments of the present invention.

FIG. 6 is a bottom view illustration of a plate with a shaft attached thereto, with a hollow channel area seen extending radially outward from the portion of the plate which resides within the center of the hollow shaft. Within this hollow channel area there may be a one or more thermocouple wells which allow for the insertion of thermocouples to heater element zones which could not otherwise be directly monitored.

Figure 7:
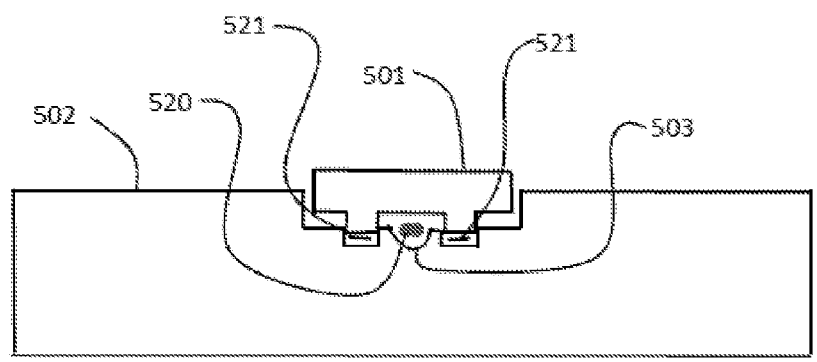
FIG. 7 is an illustrative view of a joined cover plate according to some embodiments of the present invention.

FIG. 7 illustrates a cross-sectional view of a heater plate 502 with a hollow area 503 and cover plate 501 according to some embodiments of the present invention. The cover plate 501 may be adapted to fit within a slot in the bottom of the heater plate. Below the slot, a channel 503 may be present adapted to route electrical coupling 520 from the thermocouples to the shaft center. The joints 521 attaching the cover plate 501 to the heater plate 502 bridge different atmospheres, as the channel may see the atmosphere within the center of the shaft, which likely will be oxygenated. This atmosphere within the channel may allow for significantly better thermocouple function for a thermocouple within the channel area. The other side of the joint will see the atmosphere within the process chamber, which may include corrosive process gasses, such as fluorine chemistries. An appropriate joining method results in a joint compatible with these various atmospheres.

Figure 8:
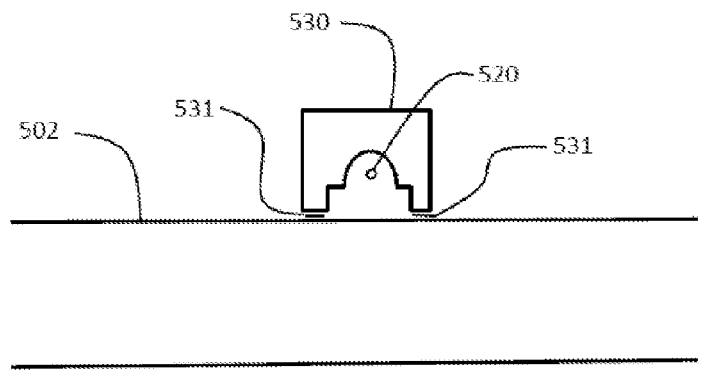
FIG. 8 is an illustrative view of a cover plate according to some embodiments of the present invention.

FIG. 8 illustrates a cross-sectional view of a heater plate with a hollow cover 530 plate adapted to be joined to the bottom of a heater plate 502. The hollow cover plate 530 may cover thermocouple coupling wires 520 as well as thermocouple wells in the bottom of the heater plate. In such embodiments, the channel is within the cover plate as opposed to the main heater plate structure.

Figure 9:
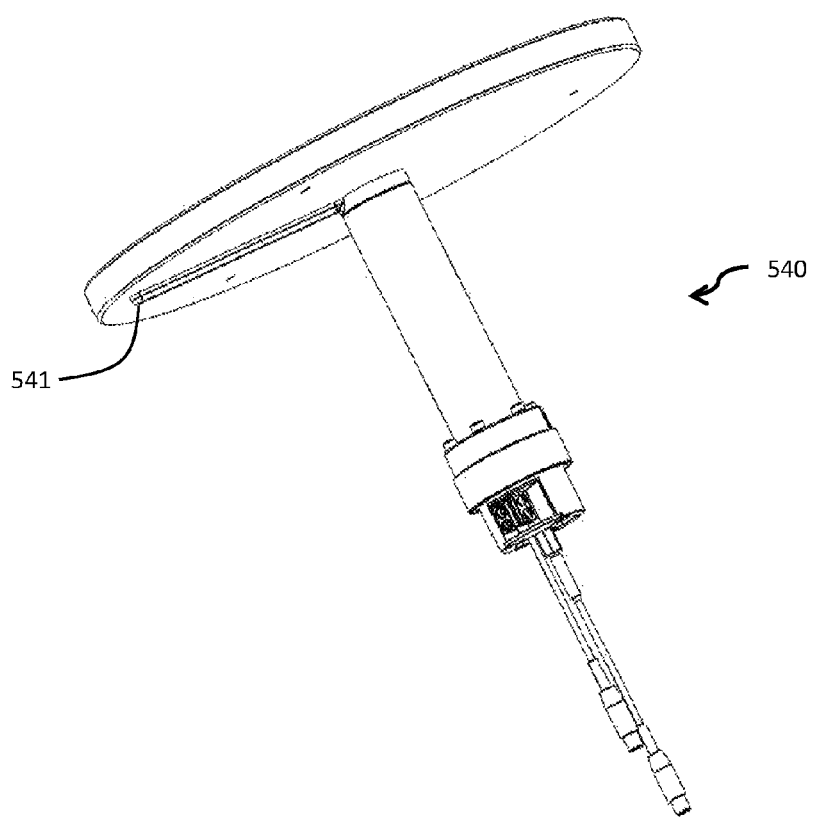
FIG. 9 is a perspective view of a heater according to some embodiments of the present invention.
Figure 10:
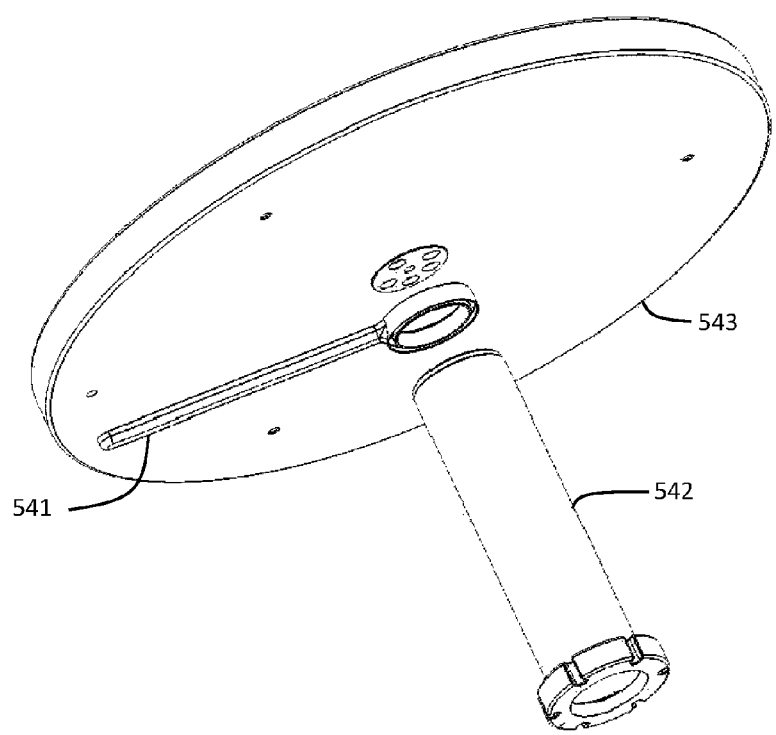
FIG. 10 is a perspective exploded view of a heater according to some embodiments of the present invention.

FIGS. 9 and 10 illustrate, in perspective and partially exploded perspective views, respectively, a heater 540 according to some embodiment of the present invention. The hollow cover plate 541 may have a contiguous ring feature adapted to reside between the shaft 542 and the bottom of the heater plate 543. The hollow cover plate 541 allows for the routing of thermocouple wires from the bottom of the plate, outside of the perimeter of the shaft, to the center of the shaft. The heater plate 543, hollow cover plate 541, and shaft 542 may be simultaneously joined in a single heating operation which brazes the components together in some embodiments.

Figure 11:
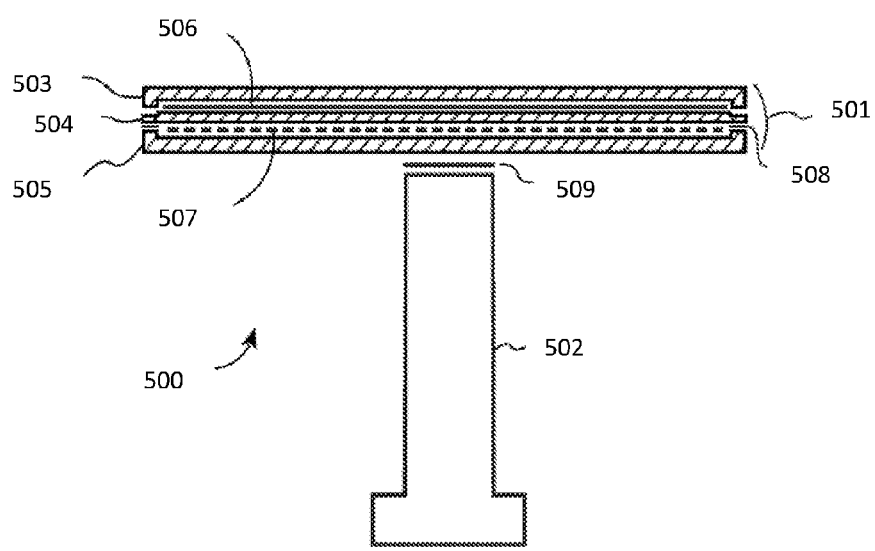
FIG. 11 is an illustrative cross-sectional view of a heater with a multi-layer plate according to some embodiments of the present invention.

In some embodiments of the present invention, as seen in expanded view in FIG. 11, a plate and shaft device 500 is seen with a plate assembly 501 and a shaft 502. The plate assembly 501 has layers 503, 504, 505 which are fully fired ceramic layers prior to their assembly into the plate assembly 501. The top plate layer 503 overlays the middle layer 504 with an electrode layer 506 residing between the top plate layer 503 and the middle layer 504. The middle layer 504 overlays the bottom layer 505 with a heater layer 507 residing between the middle layer 504 and the bottom layer 505.

In some embodiments, thermocouples may be mounted in between plate layers in order to monitor temperatures at different locations. A multi-layer plate assembly may allow for access to areas on one or more surfaces of one or more of the plates such that machining of surfaces may be done after the final firing of a ceramic plate layer. Further, this access to surfaces may also allow for the assembly of components into the surfaces of the plate layers, and into the spaces between the plate layers.

The layers 503, 504, 505 of the plate assembly 501 may be of a ceramic such as aluminum nitride in the case of a heater, or other materials including alumina, doped alumina, AlN, doped AlN, beryllia, doped beryllia and others in the case of an electrostatic chuck. The layers 503, 504, 505 of the plate assembly that makes up the substrate support may have been fully fired ceramic prior to their introduction into the plate assembly 501. For example, the layers 503, 504, 505 may have been fully fired as plates in a high temperature high contact pressure specialty oven, or tape cast, or spark-plasma sintered, or other method, and then machined to final dimension as required by their use and their position in the stack of the plate assembly. The plate layers 503, 504, 505 may then be joined together using a brazing process with joining layers 508 which allow the final assembly of the plate assembly 501 to be done without the need for a specialty high temperature oven equipped with a press for high contact stresses.

In embodiments wherein a shaft is also part of the final assembly, such as in the case of a plate and shaft device, the plate assembly 501 to shaft 502 joining process step may also use a brazing process done without the need for a specialty high temperature oven equipped with a press for high contact stresses. The joining of the plate layers, and the plate assembly to the shaft, may be done in a simultaneous process step in some embodiments. The shaft 502 may be joined to the plate assembly 501 with a joining layer 509. The joining layer 509 may be a brazing element which is identical to the joining layers 508 in some embodiments.

An improved method for manufacturing a plate, or plate assembly, may involve the joining of layers of the plate assembly, which have been described above and are described in more detail below, into a final plate assembly without the time consuming and expensive step of an additional processing with high temperatures and high contact pressures. The plate layers may be joined with a brazing method for joining ceramics according to embodiments of the present invention. An example of a brazing method for joining together first and second ceramic objects may include the steps of bringing the first and second objects together with a brazing layer selected from the group consisting of aluminum and an aluminum alloy disposed between the first and second ceramic objects, heating the brazing layer to a temperature of at least 800 C, and cooling the brazing layer to a temperature below its melting point so that the brazing layer hardens and creates a hermetic seal so as to join the first member to the second member. Various geometries of braze joints may be implemented according to methods described herein.

In some embodiments of the present invention a plate assembly with layers may be presented such that standoffs are present between the layers of the plate such that when the joining layer is heated, and slight pressure is applied axially to the plates, there is slight axial compression such that the joining layer is mildly thinned until the standoff on one plate contacts the adjacent plate. In some aspects, this allows for not just control of the joint thickness but also for dimensional and tolerance control of the plate assembly. For example, the parallelism of features of the various plates can be set by machine tolerances on the plate layers, and this aspect can be maintained during the joining process with the use of standoffs. In some embodiments, post-joining dimensional control may be achieved using a circumferential outer ring on one plate layer which overlays an inner ring on an adjacent layer to provide axial conformance. In some embodiments, one of the outer ring or the inner ring may also contact the adjacent plate in an axial direction perpendicular to the plate such that positional control is also achieved in that axial direction. The axial positional control may also thus determine the final thickness of a joining layer between the two adjacent plates.

In some embodiments of the present invention an electrode between layers may be of the same material as the joining layer, and may function in a dual capacity of both the joining layer and the electrode. For example, the area previously occupied by an electrode in an electrostatic chuck may instead be occupied by a joining layer which has the dual function of performing as an electrode, for providing electrostatic clamping force for example, and of performing as a joining layer to join the two plates between which the joining layer resides. In such embodiments, a labyrinth may be around the periphery of the two joined plate such that line of sight, and access in general, to the charged electrode from a region outside of the plate is minimized.

Figure 12:
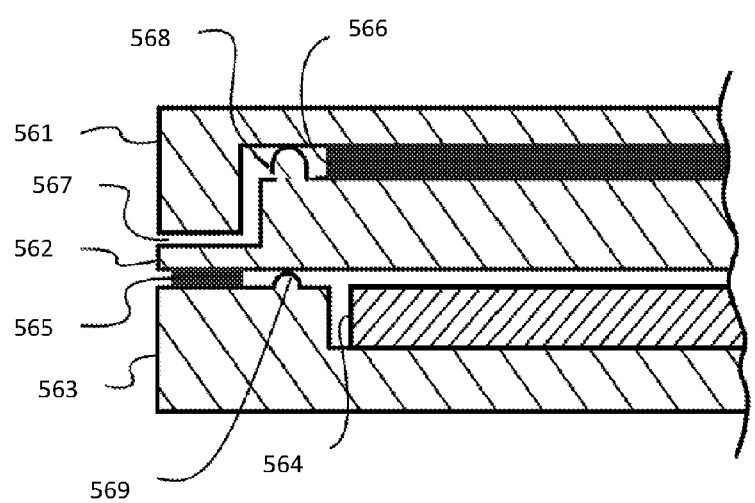
FIG. 12 is a close up partial cross-sectional view of a multi-layer plate according to some embodiments of the present invention.

FIG. 12 illustrates a partial cross-section of a plate assembly according to some embodiments of the present invention. The plate assembly is a multi-layer plate assembly with both a heater and an electrode residing between different layers. The layers are joined with brazing elements and the final position of the plates in a direction perpendicular to the plane of the primary plane of the plates is dictated by standoffs 568, 569 on the plates.

A top plate layer 561 overlays a lower plate layer 562. The lower plate layer 562 overlays a bottom plate layer 563. Although illustrated in FIG. 12 with three plate layers, different numbers of plate layers may be used according to the needs of a particular application. The top plate layer 561 is joined to the lower plate layer 562 using a multi-function joining layer 566. The multi-function joining layer 566 is adapted to provide joining of the top plate layer 561 to the lower plate layer 562 and to be an electrode. Such an electrode may be a joining layer that is substantially a circular disc, wherein the joining material also functions as an electrode. As seen in FIG. 12, a standoff 568 is adapted to provide positional control of the top plate layer 561 to the lower plate layer 562 in a vertical direction perpendicular to the primary plane of the plate layers. The rim of the top plate layer 561 is adapted to remove line of sight along the boundary 567 between the two plates at their periphery. The thickness of the joining layer 566 may be sized such that the joining layer 566 is in contact with the top plate layer 561 and the lower plate layer 562 prior to the step of heating and joining the plate assembly.

The lower plate layer 562 overlays the bottom plate layer 563. A heater 564 resides between the lower plate layer 562 and the bottom plate layer 563. A joining layer 565 joins the lower plate layer 562 to the bottom plate layer 563. The joining layer 565 may be an annular ring within the periphery of the plate layers. A standoff 569 is adapted to provide positional control of the lower plate layer 562 to the bottom plate layer 563 in a vertical direction perpendicular to the primary plane of the plate layers. During a joining step of the plate assembly, the components as seen in FIG. 12 may be pre-assembled, and then this plate pre-assembly may be joined using processes described herein to form a completed plate assembly. In some embodiments, this plate pre-assembly may be further preassembled with a shaft and shaft joining layer such that a complete plate and shaft device may be joined in a single heating process. This single heating process may not require a high temperature oven, or a high temperature oven with presses adapted to provide high contact stresses. In addition, in some embodiments the completed plate and shaft assembly may not require any post-joining machining yet may still meet the tolerance requirements of such a device in actual use in semiconductor manufacturing.

In some embodiments, the top plate layer and the bottom plate layer are aluminum nitride. In some embodiments the joining layer is aluminum. Examples of the joining process and materials are discussed below.

Figure 13:
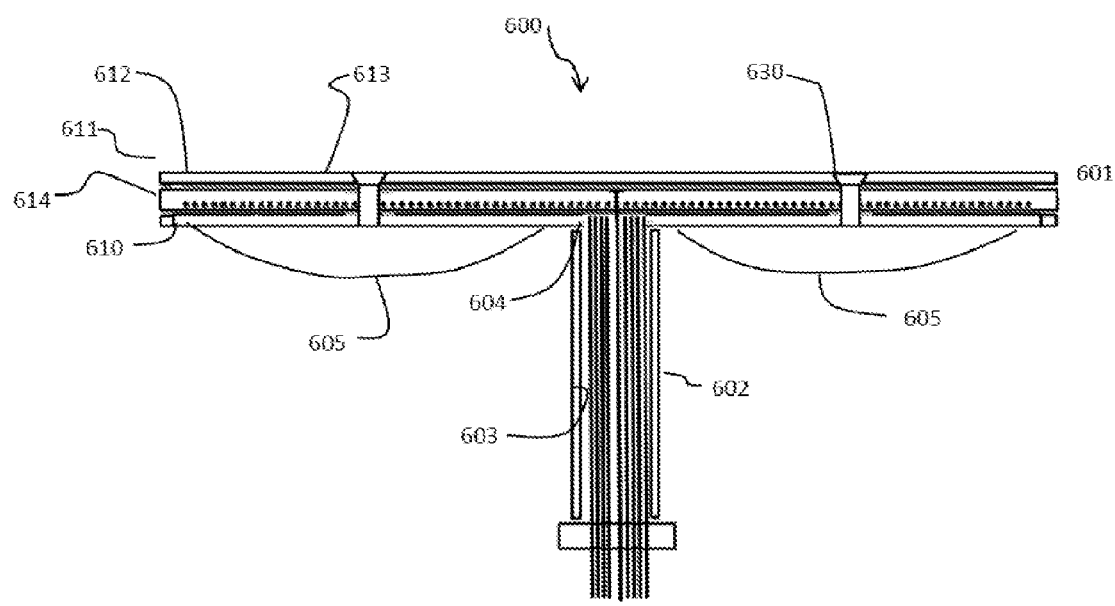
FIG. 13 is an illustrative cross-sectional view of a heater with multiple heater zones and thermocouples according to some embodiments of the present invention.

FIG. 13 is an illustrative cross-sectional view of a heater 600 with multiple heater zones and multiple thermocouples using a multi-layer plate 601 according to some embodiments of the present invention. In these embodiments, the use of a hermetic joining layer, also adapted to withstand corrosive processing chemistries, allows for the insertion of thermocouples into the portion 605 of the plate outside of the area circumscribed by the interior 603 of the shaft 602, yet protected from the corrosive process gasses to which the heater may be subjected.

In some embodiments, the use of a multi-layer plate allows for access to a space between layers in which thermocouples can be placed into regions otherwise not able to be monitored. For example, in a plate and shaft device 600 such as seen in FIG. 13, all power and monitoring are typically routed through the hollow center 603 of the shaft 602, and out of the processing chamber via a chamber feedthrough. In prior art devices wherein the entire ceramic plate and shaft device was hot sintered together, the only available area in which to embed a thermocouple, and route the telemetry down the hollow shaft, was in the area within the center of the hollow shaft. For example, a hole could be drilled in the bottom of the plate using a long drill adapted to go down the center of the hollow shaft. A thermocouple could then be inserted into that hole, and be used to monitor the temperature of the plate in that central region only. This limitation on the location of where a thermocouple could be mounted precluded the monitoring of temperatures at locations which fell outside of the interior of the hollow shaft.

In some embodiments, a central hub 604 may be used to help facilitate the sealing of the inter-layer space between plate layers from the atmosphere which may be present within the shaft. In such embodiments, the central hub 604 may act as a feed through from the central portion of the shaft and the inter-layer space between plate layers.

Figure 17:
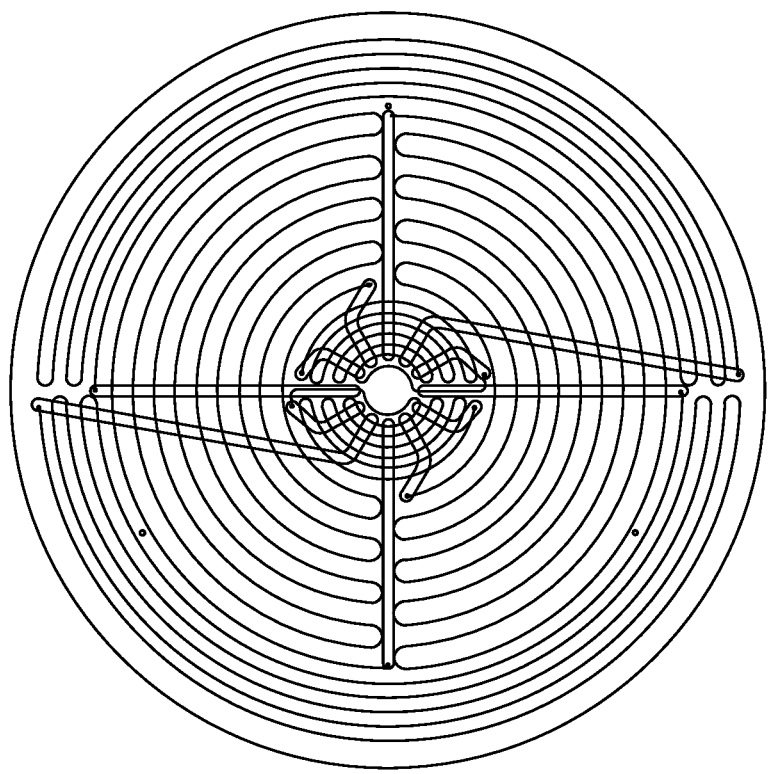
FIG. 17 is a mapping illustration of multiple heater zones according to some embodiments of the present invention.

The plate 601 of the heater 600 may be assembled from three plate layers in some embodiments. Each of the plate layers may be of a fully fired ceramic such as aluminum nitride. Each of the plate layers may be previously machined to a final, or near final, dimension prior to being assembled into the multi-layer plate assembly. A top plate layer 612 may overlay a middle plate layer 611, which may in turn overlay a bottom plate layer 610. The middle plate layer may be joined around its periphery to the bottom plate layer 610 with a joining layer 610. A metal layer 613 between the top plate layer 612 and the middle plate layer 611 may function as an RF layer, and as the joining layer between the plate layers. There may be one or more heater elements between the middle plate layer 611 and the lower plate layer 610. The middle plate layer 611 may be adapted to receive the heater elements such that the heater elements 621 reside in grooves in the bottom of the middle plate layer 611. An example of a multi-zone heater element layout is seen in FIG. 17. The heater element is split into three radial zones, each of which have two halves, for a total of six elements. Two of the radial zones are fully outside 605 the periphery of the interior of the hollow shaft. Thus, thermocouples located in those zones adapted to provide temperature monitoring would be placed into the plate at a radial distance greater than the shaft interior radius. The heater elements 621 may be of molybdenum, and may be potted into the grooves with an AlN potting compound 622. Power leads for the heater elements may splay out from the central hub to route power to the individual heater circuits.

In embodiments such as seen in FIGS. 13-16, the bottom surface of the middle plate layer 611 may see installation of a variety of components. In some aspects, grooves may be machined into this surface for the installation of heater elements. Holes may be drilled into this surface to act as thermocouples wells for installation of thermocouples. After this machining, the heater elements may be installed and potted. In some embodiments, the heater elements may be molybdenum wires placed in the grooves. In some embodiments, the heater elements may be deposited into the grooves using a thick film deposition technique. The thermocouples may be installed and potted as well. The heater elements may be attached to the power leads, which may be bus bars. In embodiments wherein a central hub is used, power leads and thermocouple leads may be routed through the central hub. The multi-layer plate stack may be assembled, such as in an upside down fashion, wherein all elements, including braze layers, are assembled into a pre-assembly which would then be processed into a final, complete, heater assembly. A brazing step according to descriptions herein would join all of the components with a hermetic seal adapted to withstand the atmospheres that the heater would see while supporting semiconductor manufacturing, which may include oxygenated atmospheres, and fluorine chemistries.

Figure 14:
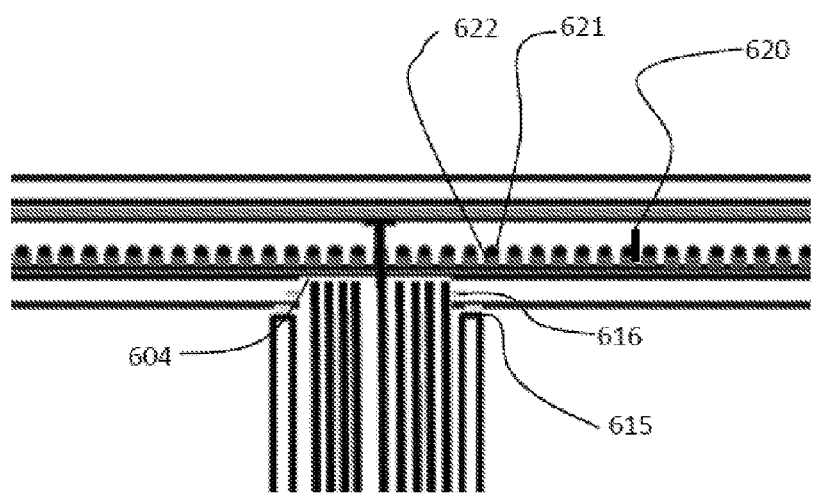
FIG. 14 is a close-up cross-sectional view of plate and shaft joint area according to some embodiments of the present invention.

With the routing of leads through the central hub 604, such as a thermocouple lead with an Inconel exterior, these leads may be routed through the central hub and also sealed with a brazing element. For example, a lead may be routed through a hole in the central hub which had a counterbore, and a cylindrical brazing element may be placed around the lead prior to the brazing step. The central hub 604 also allows the inter-plate space between the middle plate layer and the bottom plate layer to be hermetically sealed from the interior space of the shaft. As seen in FIG. 14, a joining layer 615 may be used to seal the shaft from the bottom of the bottom plate layer, and another joining layer 616 may be used to seal the central hub 604 from the upper surface of the bottom plate layer. In some embodiments, when the entire heater assembly is heated in vacuum during the brazing step to join all of the various surfaces that are to be attached by the various joining layers, the inter plate spaces will be sealed in a vacuum condition with hermetic seals. In some aspects, having the inter plate space wherein the thermocouples are mounted will better thermally isolate the thermocouples from temperatures seen in areas other than where they are mounted.

Figure 15:
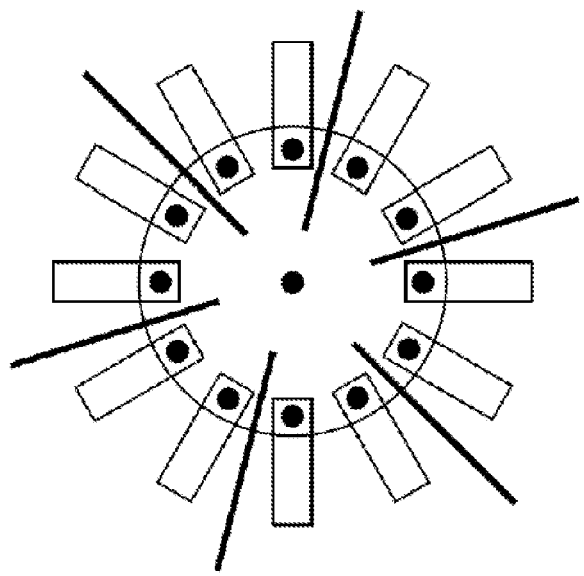
FIG. 15 is a top view of a central hub according to some embodiments of the present invention.
Figure 16:
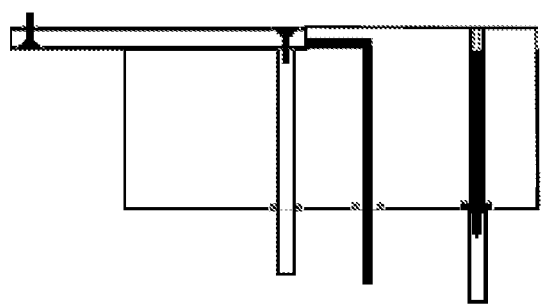
FIG. 16 is a partial cross-sectional view illustrating aspects of a central hub according to some embodiment of the present invention.

FIGS. 15 and 16 illustrate the central hub 604 in top and partial cross-sectional views, respectively. The central hub may be used as a hermetic feedthrough which isolates the central area of the shaft from the inter plate space between the middle plate layer and the bottom plate layer. The leads which supply power to the heaters, and the thermocouple leads, may be routed through the central hub and sealed with the brazing material in the same brazing process step which joins and seals the other components to each other.

FIG. 17 illustrates a multi-zone heater element as seen in some embodiments of the present invention. The heater element is split into three radial zones, each of which have two halves, for a total of six elements. Two of the radial zones are fully outside 605 the periphery of the interior of the hollow shaft.

Joining methods according to some embodiments of the present invention rely on control of wetting and flow of the joining material relative to the ceramic pieces to be joined. In some embodiments, the absence of oxygen during the joining process allows for proper wetting without reactions which change the materials in the joint area. With proper wetting and flow of the joining material, a hermetically sealed joint can be attained at relatively low temperature. In some embodiments of the present invention, a pre-metallization of the ceramic in the area of the joint is done prior to the joining process.

In some applications where end products of joined ceramics are used, strength of the joint may not be the key design factor. In some applications, hermeticity of the joint may be required to allow for separation of atmospheres on either side of the joint. Also, the composition of the joining material may be important such that it is resistant to chemicals which the ceramic assembly end product may be exposed to. The joining material may need to be resistant to the chemicals, which otherwise might cause degeneration of the joint, and loss of the hermetic seal. The joining material may also need to be of a type of material which does not negatively interfere with the processes later supported by the finished ceramic device.

In some embodiments of the present invention, the joined ceramic assembly is composed of a ceramic, such as aluminum nitride. Other materials, such as alumina, silicon nitride, silicon carbide or beryllium oxide, may be used. In some aspects, a first ceramic piece may be aluminum nitride and a second ceramic piece may be aluminum nitride, zirconia, alumina, or other ceramic. In some present processes, the joined ceramic assembly components may first be manufactured individually in an initial process involving a process oven wherein the first piece 72 and the second piece 71 are formed. In some embodiments, a recess may be included in one of the mating pieces, which allows the other mating piece to reside within the recess.

In some embodiments, the joint may include a plurality of standoffs adapted to maintain a minimum braze layer thickness. In some embodiments, one of the ceramic pieces, such as the shaft, may utilize a plurality of standoffs mesas on the end of the shaft which is to be joined to the plate, or on the surface where the cover is to be joined to the plate, for example. The mesas may be part of the same structure as the ceramic piece, and may be formed by machining away structure from the piece, leaving the mesas. The mesas may abut the end of the ceramic piece after the joining process. In some embodiments, the mesas may be used to create a minimum braze layer thickness for the joint. In some embodiments, the braze layer material, prior to brazing, will be thicker than the distance maintained by the mesas or powder particles between the shaft end and the plate. In some embodiments, other methods may be used to establish a minimum braze layer thickness. In some embodiments, ceramic spheres may be used to establish a minimum braze layer thickness. In some aspects, the joint thickness may be slightly thicker than the dimension of the standoffs, or other minimum thickness determining device, as not quite all of the braze material may be squeezed out from between the standoffs and the adjacent interface surface. In some aspects, some of the aluminum braze layer may be found between the standoff and the adjacent interface surface. In some embodiments, the brazing material may be 0.006 inches thick prior to brazing with a completed joint minimum thickness of 0.004 inches. The brazing material may be aluminum with 0.4 Wt.% Fe. In some embodiments, standoffs are not used.

A braze material which will be compatible with both of the types of atmospheres described above when they are seen on both sides across a joint in such a device is aluminum. Aluminum has a property of forming a self-limiting layer of oxidized aluminum. This layer is generally homogenous, and, once formed, prevents or significantly limits additional oxygen or other oxidizing chemistries (such a fluorine chemistries) penetrating to the base aluminum and continuing the oxidation process. In this way, there is an initial brief period of oxidation or corrosion of the aluminum, which is then substantially stopped or slowed by the oxide (or fluoride) layer which has been formed on the surface of the aluminum. The braze material may be in the form of a sheet, a powder, a thin film, or be of any other form factor suitable for the brazing processes described herein. For example, the brazing layer may be a sheet having a thickness ranging from 0.00019 inches to 0.011 inches or more. In some embodiments, the braze material may be a sheet having a thickness of approximately 0.0012 inches. In some embodiments, the braze material may be a sheet having a thickness of approximately 0.006 inches. Typically, alloying constituents (such as magnesium, for example) in aluminum are formed as precipitates in between the grain boundaries of the aluminum. While they can reduce the oxidation resistance of the aluminum bonding layer, typically these precipitates do not form contiguous pathways through the aluminum, and thereby do not allow penetration of the oxidizing agents through the full aluminum layer, and thus leaving intact the self-limiting oxide-layer characteristic of aluminum which provides its corrosion resistance. In the embodiments of using an aluminum alloy which contains constituents which can form precipitates, process parameters, including cooling protocols, would be adapted to minimize the precipitates in the grain boundary. For example, in one embodiment, the braze material may be aluminum having a purity of at least 99.5%. In some embodiments, a commercially available aluminum foil, which may have a purity of greater than 92%, may be used. In some embodiments, alloys are used. These alloys may include Al-5 w % Zr, Al-5 w % Ti, commercial alloys #7005, #5083, and #7075. These alloys may be used with a joining temperature of 1100 C in some embodiments. These alloys may be used with a temperature between 800 C and 1200 C in some embodiments. These alloys may be used with a lower or higher temperature in some embodiments.

The non-susceptibility of AlN to diffusion with aluminum under the conditions of processes according to embodiments of the present invention results in the preservation of the material properties, and the material identity, of the ceramic after the brazing step in the manufacturing of the plate and shaft assembly.

In some embodiments, the joining process is performed in a process chamber adapted to provide very low pressures. Joining processes according to embodiments of the present invention may require an absence of oxygen in order to achieve a hermetically sealed joint. In some embodiments, the process is performed at a pressure lower than $1 \times 10E-4$ Torr. In some embodiments, the process is performed at a pressure lower than $1 \times 10E-5$ Torr. In some embodiments, further oxygen removal is achieved with the placement of zirconium or titanium in the process chamber. For example, a zirconium inner chamber may be placed around the pieces which are to be joined.

In some embodiments, atmospheres other than vacuum may be used to achieve a hermetic seal. In some embodiments, argon (Ar) atmosphere may be used to achieve hermetic joints. In some embodiments, other noble gasses are used to achieve hermetic joints. In some embodiments, hydrogen (H2) atmosphere may be used to achieve hermetic joints.

The wetting and flow of the brazing layer may be sensitive to a variety of factors. The factors of concern include the braze material composition, the ceramic composition, the chemical makeup of the atmosphere in the process chamber, especially the level of oxygen in the chamber during the joining process, the temperature, the time at temperature, the thickness of the braze material, the surface characteristics of the material to be joined, the geometry of the pieces to be joined, the physical pressure applied across the joint during the joining process, and/or the joint gap maintained during the joining process.

In some embodiments, the surfaces of the ceramic may undergo a metallization prior to the placement of the ceramic pieces into a chamber for joining. The metallization may be a frictional metallization in some embodiments. The frictional metallization may comprise the use of an aluminum rod. A rotary tool may be used to spin the aluminum rod over areas which will be adjacent to the brazing layer when the piece is joined. The frictional metallization step may leave some aluminum in the surface of the ceramic piece. The frictional metallization step may alter the ceramic surface somewhat, such as by removing some oxides, such that the surface is better adapted for wetting of the brazing material. The metallization step may be a thin film sputtering in some embodiments.

An example of a brazing method for joining together first and second ceramic objects may include the steps of bringing the first and second objects together with a brazing layer selected from the group consisting of aluminum and an aluminum alloy disposed between the first and second ceramic objects, heating the brazing layer to a temperature of at least 800 C, and cooling the brazing layer to a temperature below its melting point so that the brazing layer hardens and creates a hermetic seal so as to join the first member to the second member. Various geometries of braze joints may be implemented according to methods described herein.

A joining process according to some embodiments of the present invention may comprise some or all of the following steps. Two or more ceramic pieces are selected for joining. In some embodiments, a plurality of pieces may be joined using a plurality of joining layers in the same set of process steps, but for the sake of clarity of discussion two ceramic pieces joined with a single joining layer will be discussed herein. The ceramic pieces may be of aluminum nitride. The ceramic pieces may be of mono-crystalline or poly-crystalline aluminum nitride. Portions of each piece have been identified as the area of each piece which will be joined to the other. In an illustrative example, a portion of the bottom of a ceramic plate structure will be joined to the top of a ceramic hollow cylindrical structure. The joining material may be a brazing layer comprising aluminum. In some embodiments, the brazing layer may be a commercially available aluminum foil of >99% aluminum content. The brazing layer may consist of a plurality of layers of foil in some embodiments.

In some embodiments, the specific surface areas which will be joined will undergo a pre-metallization step. This pre-metallization step may be achieved in a variety of ways. In one method, a frictional pre-metallization process is employed, using a rod of material, which may be 6061 aluminum alloy, may be spun with a rotary tool and pressed against the ceramic in the joint area, such that some aluminum may be deposited onto each of the two ceramic pieces in the area of the joint. In another method, PVD, CVD, electro-plating, plasma spray, or other methods may be used to apply the pre-metallization.

Prior to joining, the two pieces may be fixtured relative to each other to maintain some positional control while in the process chamber. The fixturing may also aid in the application of an externally applied load to create contact pressure between the two pieces, and across the joint, during the application of temperature. A weight may be placed on top of the fixture pieces such that contact pressure in applied across the joint. The weight may be proportioned to the area of the brazing layer. In some embodiments, the contact pressure applied across the joint may be in the range of approximately 2-500 psi onto the joint contact areas. In some embodiments the contact pressure may be in the range of 2-40 psi. In some embodiments, minimal pressure may be used. The contact pressure used at this step is significantly lower than that seen in the joining step using hot pressing/sintering as seen in prior processes, which may use pressures in the range of In embodiments using mesas as standoffs, or using other methods of joint thickness control such as ceramic spheres, the original thickness of the brazing layer prior to the application of heat may be larger than the height of the mesas. As the brazing layer temperature reaches and exceeds the liquidus temperature, pressure across the brazing layer between the pieces being joined will cause relative motion between the pieces until the mesas on a first piece contact an interface surface on a second piece. At that point, contact pressure across the joint will no longer be supplied by the external force (except as resistance to repulsive forces within the brazing layer, if any). The mesas may prevent the brazing layer from being forced out of the joint area prior to the full wetting of ceramic pieces, and may thus allow better and/or full wetting during the joining process. In some embodiments, mesas are not used.

The fixtured assembly may be placed in a process oven. The oven may be evacuated to a pressure of less than 5×10E−5 Torr. In some aspects, vacuum removes the residual oxygen. In some embodiments, a vacuum of lower than 1×10E−5 Torr is used. In some embodiments, the fixtured assembly is placed within a zirconium inner chamber which acts as an oxygen attractant, further reducing the residual oxygen which might have found its way towards the joint during processing. In some embodiments, the process oven is purged and re-filled with pure, dehydrated pure noble gas, such as argon gas, to remove the oxygen. In some embodiments, the process oven is purged and re-filled with purified hydrogen to remove the oxygen.

The fixture assembly is then subjected to increases in temperature, and a hold at the joining temperature. Upon initiating the heating cycle, the temperature may be raised slowly, for example 15 C per minute to 200 C and then 20 C per minute thereafter, to standardized temperatures, for example, 600 C and the joining temperature, and held at each temperature for a fixed dwell time to allow the vacuum to recover after heating, in order to minimize gradients and/or for other reasons. When the braze temperature has been reached, the temperature can be held for a time to effect the braze reaction. In an exemplary embodiment, the dwell temperature may be 800 C and the dwell time may be 2 hours. In another exemplary embodiment, the dwell temperature may be 1000 C and the dwell time may be 15 minutes. In another exemplary embodiment, the dwell temperature may be 1150 and the dwell time may be 30-45 minutes. In some embodiments, the dwell temperature does not exceed a maximum of 1200 C. In some embodiments, the dwell temperature does not exceed a maximum of 1300 C. Upon achieving sufficient braze dwell time, the furnace may be cooled at a rate of 20 C per minute, or lower when the inherent furnace cooling rate is less, to room temperature. The furnace may be brought to atmospheric pressure, opened and the brazed assembly may be removed for inspection, characterization and/or evaluation.

The use of too high of a temperature, for too long of a time period, may lead to voids forming in the joining layer as the result of significant aluminum evaporation. As voids form in the joining layer, the hermeticity of the joint may be lost. The process temperature and the time duration of the process temperature may be controlled such that the aluminum layer does not evaporate away, and so that a hermetic joint is achieved. With proper temperature and process time duration control, in addition to the other process parameters described above, a continuous joint may be formed. A continuous joint achieved in accord with embodiments as described herein will result in a hermetic sealing of the parts, as well as a structural attachment.

The brazing material will flow and allow for wetting of the surfaces of the ceramic materials being joined. When ceramic such as aluminum nitride is joined using aluminum brazing layers and in the presence of sufficiently low levels of oxygen and described herein, the joint is a hermetic brazed joint. This stands in contrast to the diffusion bonding seen in some prior ceramic joining processes.

In some embodiments, the pieces to be joined may be configured such that no pressure is placed across the brazing layer during brazing. For example, a post or shaft may be placed into a countersunk hole or recess in a mating piece. The countersink may be larger than the exterior dimension of the post or shaft. This may create an area around the post or shaft which then may be filled with aluminum, or an aluminum alloy. In this scenario, pressure placed between the two pieces in order to hold them during joining may not result in any pressure across the braze layer. Also, it may be possible to hold each piece in the preferred end position using fixturing such that little or no pressure is placed between the pieces at all.

Joined assemblies joined as described above result in pieces with hermetic sealing between the joined pieces. Such assemblies are then able to be used where atmosphere isolation is an important aspect in the use of the assemblies. Further, the portion of the joint which may be exposed to various atmospheres when the joined assemblies are later used in semi-conductor processing, for example, will not degrade in such atmospheres, nor will it contaminate the later semi-conductor processing.

Both hermetic and non-hermetic joints may join pieces strongly, in that significant force is needed to separate the pieces. However, the fact that a joint is strong is not determinative of whether the joint provides a hermetic seal. The ability to obtain hermetic joints may be related to the wetting of the joint. Wetting describes the ability or tendency of a liquid to spread over the surface of another material. If there is insufficient wetting in a brazed joint, there will be areas where there is no bonding. If there is enough non-wetted area, then gas may pass through the joint, causing a leak. Wetting may be affected by the pressure across the joint at different stages in the melting of the brazing material. The use of mesa standoffs, or other standoff device such as the insertion of ceramic spheres or powder particles of appropriate diameter, to limit the compression of the brazing layer beyond a certain minimum distance may enhance the wetting of the areas of the joint. Careful control of the atmosphere seen by the brazing element during the joining process may enhance the wetting of the areas of the joint. In combination, careful control of the joint thickness, and careful control of the atmosphere used during the process, may result in a complete wetting of the joint interface area that is not able to be achieved with other processes. Further, the use of a brazing layer that is of a proper thickness, which may be thicker than the mesa standoff height, in conjunction with the other referenced factors, may result in a very well wetted, hermetic, joint. Although a variety of joining layer thicknesses may be successful, an increased thickness of the joining layer may enhance the success rate of the joint's hermetic aspect.

The presence of a significant amount of oxygen or nitrogen during the brazing process may create reactions which interfere with full wetting of the joint interface area, which in turn may result in a joint that is not hermetic. Without full wetting, non-wetted areas are introduced into the final joint, in the joint interface area. When sufficient contiguous non-wetted areas are introduced, the hermeticity of the joint is lost.

The presence of nitrogen may lead to the nitrogen reacting with the molten aluminum to form aluminum nitride, and this reaction formation may interfere with the wetting of the joint interface area. Similarly, the presence of oxygen may lead to the oxygen reacting with the molten aluminum to form aluminum oxide, and this reaction formation may interfere with the wetting of the joint interface area. Using a vacuum atmosphere of pressure lower than $5 \times 10^{-5}$ Torr has been shown to have removed enough oxygen and nitrogen to allow for fully robust wetting of the joint interface area, and hermetic joints. In some embodiments, use of higher pressures, including atmospheric pressure, but using non-oxidizing gasses such as hydrogen or pure noble gasses such as argon, for example, in the process chamber during the brazing step has also led to robust wetting of the joint interface area, and hermetic joints. In order to avoid the oxygen reaction referred to above, the amount of oxygen in the process chamber during the brazing process must be low enough such that the full wetting of the joint interface area is not adversely affected. In order to avoid the nitrogen reaction referred to above, the amount of nitrogen present in the process chamber during the brazing process must be low enough such that the full wetting of joint interface area is not adversely affected.

The selection of the proper atmosphere during the brazing process, coupled with maintaining a minimum joint thickness, may allow for the full wetting of the joint. Conversely, the selection of an improper atmosphere may lead to poor wetting, voids, and lead to a non-hermetic joint. The appropriate combination of controlled atmosphere and controlled joint thickness along with proper material selection and temperature during brazing allows for the joining of materials with hermetic joints.

In some embodiments of the present invention wherein one or both of the ceramic surfaces is pre-metallized prior to brazing, such as with aluminum thin film sputtering, the joining process steps may use a lower temperature held for shorter duration. Upon initiating the heating cycle, the temperature may be raised slowly, for example 15 C per minute to 200 C and then 20 C per minute thereafter, to standardized temperatures, for example, 600 C and the joining temperature, and held at each temperature for a fixed dwell time to allow the vacuum to recover after heating, in order to minimize gradients and/or for other reasons. When the braze temperature has been reached, the temperature can be held for a time to effect the braze reaction. In some embodiments using a pre-metallization of one or more of the interface surfaces, the brazing temperature may be in the range of 600 C to 850 C. In an exemplary embodiment, the dwell temperature may be 700 C and the dwell time may be 1 minute. In another exemplary embodiment, the dwell temperature may be 750 C and the dwell time may be 1 minute. Upon achieving sufficient braze dwell time, the furnace may be cooled at a rate of 20 C per minute, or lower when the inherent furnace cooling rate is less, to room temperature. The furnace may be brought to atmospheric pressure, opened and the brazed assembly may be removed for inspection, characterization and/or evaluation.

Relative to aluminum brazing processes without a layer of aluminum deposited onto the joint interface areas, processes wherein the ceramic has had a thin layer of aluminum deposited thereon, such as with a thin film sputtering technique, yield hermetic joints at low temperatures and with very short dwell times at the braze temperature. The use of a deposited layer of aluminum on the interface surface may make the wetting of the surface comparatively easier, and needing less energy, allowing for the use of lower temperatures and shortened dwell times to achieve a hermetic joint.

A process summary for such a brazing process is seen as follows: The joint was between two pieces of poly-crystalline aluminum nitride. The brazing layer material was of 0.003" thickness of 99.8% aluminum foil. The joint interface area of the ring piece was metallized using a thin film deposition of 2 microns of aluminum. The joining temperature was 780 C held for 10 minutes. The joining was done in a process chamber held at pressure lower than 6×10E−5 Torr. The joint thickness was maintained using 0.004" diameter ZrO2 spheres. The first piece (ring) piece underwent an etching process prior to the deposition of the thin layer of aluminum. Acoustic imaging of the joint integrity showed a solid dark color in locations where there was good wetting onto the ceramic. Good and sufficient integrity of the joint was seen. This joint was hermetic. Hermeticity was verified by having a vacuum leak rate of <1×10E−9 sccm He/sec; as verified by a standard commercially available mass spectrometer helium leak detector.

The manufacture of a multi-zone heater assembly, with thermocouple monitoring of the zones of the heater, according to embodiments of the present invention, allows for insertion of thermocouples after the final firing of the ceramic pieces of the heater. The thermocouples are also protected from the exterior environment to which the heater will be subjected during semiconductor processing, which may include corrosive gasses, by a hermetic seal adapted to withstand significant temperatures and those corrosive gasses. In addition, the hermetic seals are also the structural joints, and the multi-component assemblies may be structurally connected, and hermetically sealed, with a single brazing step.

Another advantage of the joining method as described herein is that joints made according to some embodiments of the present invention may allow for the disassembly of components, if desired, to repair or replace one of those two components. Because the joining process did not modify the ceramic pieces by diffusion of a joining layer into the ceramic, the ceramic pieces are thus able to be re-used.

In some embodiments, alignment and location of the shaft and plate is maintained by part geometries, eliminating fixturing and post-bond machining. Weighting may be used to insure there is no movement during bonding process, other than some axial movement as the braze material melts. The plate may be placed top down with a joining element within a recess in the back surface of the plate. The shaft may be inserted vertically downward into the recess within the plate. A weight may be placed on the shaft 401 to provide some contact pressure during the joining process.

In some embodiments, location and perpendicularity of shaft/plate is maintained by fixturing. Fixturing may not be precise due to thermal expansion and machining tolerances—therefore, post-bond machining may be required. The shaft diameter may be increased to accommodate required material removal to meet final dimensional requirements. Again, weighting may be used to insure there is no movement during bonding process, other than some axial movement as the braze material melts. The plate may be placed top down with a joining element above the back surface of the plate. The shaft may be placed onto the plate to create a plate and shaft pre-assembly. A fixture is adapted to support and locate the shaft. The fixture may be keyed to the plate to provide positional integrity. A weight may be placed on the shaft to provide some contact pressure during the joining process.

An aspect of the current invention is the maximum operating temperature of the bonded shaft-plate as defined by the decreasing tensile strength, with temperature, of the aluminum or aluminum alloy selected for the joining. For example, if pure aluminum is employed as the joining material, the structural strength of the bond between the shaft and plate becomes quite low as the temperature of the joint approaches the melting temperature of the aluminum, generally considered to be 660 C. In practice, when using 99.5% or purer aluminum, the shaft-plate assembly will withstand all normal and expected stresses encountered in a typical wafer processing tool to a temperature of 600 C. However, some semiconductor device fabrication processes require temperatures greater than 600 C.

A repair procedure for the unjoining of an assembly which has been joined according to embodiments of the present invention may proceed as follows. The assembly may be placed in a process oven using a fixture adapted to provide a tensile force across the joint. The fixturing may put a tensile stress of approximately 2-30 psi onto the joint contact area. The fixturing may put a larger stress across the joint in some embodiments. The fixtured assembly may then be placed in a process oven. The oven may be evacuated, although it may not be required during these steps. The temperature may be raised slowly, for example 15 C per minute to 200 C and then 20 C per minute thereafter, to standardized temperatures, for example 400C, and then to a disjoining temperature. Upon reaching the disjoining temperature, the pieces may come apart from each other. The disjoining temperature may be specific to the material used in the brazing layer. The disjoining temperature may be in the range of 600-800 C in some embodiments. The disjoining temperature may be in the range of 800-1000 C in some embodiments. The fixturing may be adapted to allow for a limited amount of motion between the two pieces such that pieces are not damaged upon separation. The disjoining temperature may be material specific. The disjoining temperature may be in the range of 450 C to 660 C for aluminum.

Prior to the re-use of a previously used piece, such as a ceramic shaft, the piece may be prepared for re-use by machining the joint area such that irregular surfaces are removed. In some embodiments, it may be desired that all of the residual brazing material be removed such that the total amount of brazing material in the joint is controlled when the piece is joined to a new mating part.

In contrast to joining methods which create diffusion layers within the ceramic, joining processes according to some embodiments of the present invention do not result in such a diffusion layer. Thus, the ceramic and the brazing material retain the same material properties after the brazing step that they had prior to the brazing step. Thus, should a piece be desired to be re-used after disjoining, the same material and the same material properties will be present in the piece, allowing for re-use with known composition and properties.

As evident from the above description, a wide variety of embodiments may be configured from the description given herein and additional advantages and modifications will readily occur to those skilled in the art. The invention in its broader aspects is, therefore, not limited to the specific details and illustrative examples shown and described.

Accordingly, departures from such details may be made without departing from the spirit or scope of the applicant's general invention.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A multi-zone heater, said multi-zone heater comprising:
    a multi-layer heater plate, said multi-layer heater plate comprising:
        a top plate layer, said top plate layer comprising ceramic;
        a bottom plate layer, said bottom plate layer comprising ceramic;
        one or more intermediate plate layers, said one or more intermediate plate layers comprising ceramic and disposed between the top plate layer and the bottom plate layer;
    a plurality of plate joining layers disposed between said plate layers, wherein said joining layers join said plate layers with hermetic joints;
    a plurality of heater element zones between two of the plate layers, said heater element zones adapted to be individually controlled;
    a plurality of thermocouples, said thermocouples mounted between two of said plate layers and located at a plurality of distances from said top plate layer, said thermocouples comprising thermocouple leads; and
    a ceramic hollow heater shaft, said ceramic hollow heater shaft comprising:
        an interior surface, said interior surface of said hollow heater shaft defining an interior of said hollow heater shaft; and
        an exterior surface, wherein said ceramic hollow heater shaft is attached to a bottom surface of said multi-layer heater plate,
    wherein each of the hermetic joints have a vacuum leak rate of $<1\times10^{-9}$ sccm He/sec and wherein said thermocouple leads are routed through the interior of said ceramic hollow heater shaft.

2. The multi-zone heater according to claim 1, wherein one or more of said thermocouples are located outside of the area circumscribed by the exterior surface of said hollow heater shaft.

3. The multi-zone heater according to claim 2 further comprising a joining layer between said hollow heater shaft and said multi-layer plate.

4. The multi-zone heater according to claim 3, wherein said plurality of plate joining layers comprise metallic aluminum.

5. The multi-zone heater according to claim 4, wherein said joining layer between said hollow heater shaft and said multi-layer plate comprises metallic aluminum.

6. The multi-zone heater according to claim 5, wherein said hollow heater shaft comprises aluminum nitride.

7. The multi-zone heater according to claim 6, wherein said plurality of plate joining layers comprise metallic aluminum.

8. The multi-zone heater according to claim 7, wherein said joining layer between said hollow heater shaft and said multi-layer plate comprises metallic aluminum.

9. The multi-zone heater according to claim 8 further comprising a central hub disposed between said hollow heater shaft and said multi-layer plate.

10. The multi-zone heater according to claim 4, wherein said plurality of plate joining layers comprise metallic aluminum of greater than 99% by weight.

11. The multi-zone heater according to claim 5, wherein said plurality of plate joining layers comprise metallic aluminum of greater than 99% by weight and wherein said joining layer between said hollow heater shaft and said multi-layer plate comprises metallic aluminum of greater than 99% by weight.

12. A multi-zone heater, said multi-zone heater comprising:
    a multi-layer heater plate, said multi-layer heater plate comprising:
        a top plate layer, said top plate layer comprising ceramic;

a bottom plate layer, said bottom plate layer comprising ceramic;

an intermediate plate layer, said intermediate plate layer comprising ceramic and disposed between said top plate layer and said bottom plate layer;

a joining layer disposed between said top plate layer and said bottom plate layer, wherein said joining layer joins said plate layers with a hermetic joint;

a plurality of heater element zones between two of the plate layers, said heater element zones adapted to be individually controlled; and a first thermocouple, said first thermocouple mounted between the top plate layer and the intermediate plate layer and a second thermocouple, said second thermocouple mounted between the intermediate plate layer and the bottom plate layer, said first and second thermocouples comprising thermocouple leads, wherein the hermetic joint has a vacuum leak rate of $<1\times10^{-9}$ sccm He/sec and; and a ceramic hollow heater shaft, said ceramic hollow heater shaft comprising:

an interior surface, said interior surface of said hollow heater shaft defining an interior of said hollow heater shaft; and an exterior surface, wherein said ceramic hollow heater shaft is attached to a bottom surface of said multi-layer heater plate;

wherein said thermocouple leads are routed through the interior of said ceramic hollow heater shaft.

13. The multi-zone heater according to claim 12, wherein said joining layer comprises metallic aluminum.

14. The multi-zone heater according to claim 13, wherein said joining layer comprises metallic aluminum of greater than 99% by weight.

15. The multi-zone heater according to claim 13, wherein said top plate layer comprises aluminum nitride.

16. The multi-zone heater according to claim 15, wherein said bottom plate layer comprises aluminum nitride.

17. A multi-zone heater, said multi-zone heater comprising:

a multi-layer heater plate, said multi-layer heater plate comprising:

a top plate layer, said top plate layer comprising ceramic;

a bottom plate layer, said bottom plate layer comprising ceramic;

one or more intermediate plate layers, said one or more intermediate plate layers comprising ceramic and disposed between the top plate layer and the bottom plate layer;

a plurality of plate joining layers disposed between said plate layers, wherein said joining layers join said plate layers with hermetic joints;

a plurality of heater element zones between two of the plate layers, said heater element zones adapted to be individually controlled;

a ceramic hollow heater shaft, said ceramic hollow heater shaft comprising:

an interior surface, said interior surface of said hollow heater shaft defining an interior of said hollow heater shaft; and an exterior surface, wherein said ceramic hollow heater shaft is attached to a bottom surface of said multi-layer heater plate; and a plurality of thermocouples, said thermocouples mounted between two of said plate layers and located at a plurality of distances from said top plate layer and from said ceramic hollow heater shaft, said thermocouples comprising thermocouple leads;

wherein each of the hermetic joints have a vacuum leak rate of $<1\times10^{-9}$ sccm He/sec and wherein said thermocouple leads are routed through the interior of said ceramic hollow heater shaft.

18. The multi-zone heater according to claim 17, wherein one or more of said thermocouples are located outside of the area circumscribed by the exterior surface of said hollow heater shaft.

19. The multi-zone heater according to claim 18 further comprising a joining layer between said hollow heater shaft and said multi-layer plate.

20. The multi-zone heater according to claim 19, wherein said plurality of plate joining layers comprise metallic aluminum.

* * * * *